(12) United States Patent
Namura et al.

(10) Patent No.: US 6,226,537 B1
(45) Date of Patent: May 1, 2001

(54) PORTABLE RADIO DEVICE

(75) Inventors: Yasuaki Namura, Kanagawa; Atsushi Tsuchida, Shizuoka; Junichi Takada, Kanagawa; Hiroshi Ohnishi, Tokyo, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/193,786

(22) Filed: Nov. 17, 1998

(30) Foreign Application Priority Data

May 23, 1997 (JP) .................................................. 9-148437

(51) Int. Cl.$^7$ .............................. H04B 1/38; H04M 1/00
(52) U.S. Cl. ............................ 455/574; 455/38.3; 455/76
(58) Field of Search ............................... 455/38.3, 76, 83, 455/88, 574, 127, 275, 277.1, 287, 343; 330/51

(56) References Cited

U.S. PATENT DOCUMENTS

| | | | |
|---|---|---|---|
| 4,087,636 | * 5/1978 | Akiyama et al. | 179/2 |
| 5,033,111 | * 7/1991 | Marui | 455/127 |
| 5,203,020 | * 4/1993 | Sato et al. | 455/38.3 |
| 5,768,691 | * 6/1998 | Matero et al. | 455/78 |
| 5,903,820 | * 5/1999 | Hagstrom | 455/82 |
| 5,909,643 | * 1/1999 | Aihara | 455/127 |
| 6,055,422 | * 4/2000 | Saitoh | 455/277.1 |
| 6,060,949 | * 9/1998 | Kaufman et al. | 330/51 |

FOREIGN PATENT DOCUMENTS

| | | |
|---|---|---|
| 0 810 802 A2 | 12/1997 | (EP) . |
| 0 813 311 A2 | 12/1997 | (EP) . |
| 2 314 706 | 1/1998 | (GB) . |

* cited by examiner

Primary Examiner—Vivian Chang
Assistant Examiner—Duc Nguyen
(74) Attorney, Agent, or Firm—Pearne & Gordon LLP

(57) ABSTRACT

A portable radio device including a frequency synthesizer 5 for producing a local signal for radio section, a digital control circuit 6 for digitally controlling a portion of or the entirety of the radio device, and a reference signal generator 1 which operates the frequency synthesizer and the digital control circuit, wherein a buffer amplifier 2 is provided between the reference signal generator and the digital control circuit, and switching means 4 is provided in parallel with the buffer amplifier between the reference signal generator and the digital control circuit. When the frequency synthesizer is inactive, the switching means is activated, and a power supply 3 of the buffer amplifier is deactivated. As a result, the power dissipated by the buffer amplifier can be reduced without deteriorating the characteristics of the frequency synthesizer.

4 Claims, 2 Drawing Sheets

PORTABLE RADIO DEVICE

BACKGROUND OF THE INVENTION

The present invention relates to a portable radio device to be used in mobile communication and, more particularly, to make the radio device compact, lightweight, portable in which the amount of electric current to be dissipated is reduced.

A TDMA/FDD (time division multiple access/frequency division duplex) scheme is employed in a personal digital cellular telecommunication system (PDC) to be used for digital mobile communication. In the TDMA/FDD scheme, a transmission frequency is distinguished from a receiving frequency, and an access signal is transmitted to the base station from each mobile station during a set of predetermined time intervals. The portable radio device is provided with high-speed switching performance so as to be able to quickly respond to switching of a radio communication channel of the mobile station while the mobile station is on the move. Further, the portable radio device requires an oscillation circuit capable of ensuring a high degree of frequency stability after switching operations.

In a conventional radio device, a phase-locked loop (PLL) synthesizer is used as an oscillation circuit. In the PLL synthesizer, a frequency divider divides a frequency signal output from a voltage-controlled oscillator (VCO) into a frequency substantially equal to a reference frequency signal. A phase comparator compares the thus-divided frequency signal with the reference frequency signal, thus calculating a phase difference between the signals. The result of such comparison is amplified and converted into a dc voltage by means of a low-pass filter. The dc voltage is delivered to a control terminal of the VCO, thus controlling the frequency signal output from the VCO.

One example of a radio communications device having such a synthesizer is described in Unexamined Japanese Patent Publication 7-283751.

As shown in FIG. 4, the radio communications device comprises an antenna 21; an antenna multiplexer 22 shared between signal receiving and signal transmission; a transmission circuit 23 for converting the frequency of a modulated transmission signal into a transmission frequency; a modulation circuit 24 for modulating a voice signal; a transmission frequency synthesizer 25 for supplying a local signal to the transmission circuit 23; a receiving circuit 27 which converts a received signal into an intermediate frequency signal by amplification of the received signal; a receiving frequency synthesizer 29 for supplying a local signal to the receiving circuit 27; a demodulation circuit 28 for extracting a voice signal from the intermediate frequency signal; an intermediate frequency synthesizer 26 for supplying a local signal to the modulation circuit 24 and the demodulation circuit 28; a reference frequency generation circuit 30 for supplying a reference frequency signal to the individual frequency synthesizers 25, 26, and 29; a power supply 33 composed of batteries; a transmission circuit power on/off switch 31 for turning on or off the power fed to a transmission system circuit; a receiving circuit power on/off switch 32 for turning on or off the power fed to a receiving system circuit; and a CPU 34 for controlling the individual frequency synthesizers 25, 26, 29 and the individual power on/off switches 31 and 32.

The reference frequency generation circuit 30 comprises an original reference frequency generation circuit 30B consisting of a stable quartz oscillation circuit and a reference frequency signal preparation circuit 30A which prepares a reference frequency signal by division of the original reference frequency and supplies the thus-prepared reference frequency signal to the individual frequency synthesizers 25, 26, and 29 while the phase difference between the reference frequency signal and the original reference frequency signal is maintained.

In this radio communications device, the signal received by the antenna 21 is delivered to the receiving circuit 27 by way of the antenna multiplexer 22, where the signal is converted into an intermediate frequency signal. The thus-converted intermediate frequency signal is input to the demodulation circuit 28, where a voice signal and a digital signal are extracted from the intermediate frequency signal.

In contrast, at the time of transmission, the modulation circuit 24 modulates a transmission intermediate frequency through use of the voice signal and the digital signal. In the transmission circuit 23 subsequent to the modulation circuit 24, the thus-modulated signal is converted into a transmission radio frequency and is transmitted from the antenna 21 by way of the antenna multiplexer 22.

The original reference frequency signal generation circuit 30B of the reference frequency signal generation circuit 30 oscillates a stable original reference frequency signal, and the reference frequency signal preparation circuit 30A generates three reference signals which are 120° out of phase with one another after division of the frequency of the original frequency signal to a certain extent. These three frequency signals are divided and delivered to the respective frequency synthesizers 25, 26, and 29.

To perform the operations set forth, the reference frequency signal preparation circuit 30A comprises a frequency divider for dividing the original reference frequency and pulse division means having a three-stage ring counter consisting of three JK flip-flops.

In this radio communications device, the reference frequency signals are divided and delivered to the respective frequency synthesizers, thereby preventing an overlap among the operation phases of the frequency synthesizers and concentration of a load current on the individual frequency synthesizers. In this way, there can be prevented a variation in the oscillation frequency of each frequency synthesizer.

Making a portable radio communications device portable and lightweight for convenience of portability and saving of power consumption for long battery life are absolute necessities. For these reasons, various ideas have been conceived.

In the foregoing radio communications device, power is supplied from the power supply 33 to the receiving circuit 27, the demodulation circuit 28, and the receiving frequency synthesizer 29 by way of the receiving circuit power on/off switch 32 only during a period of time in which a signal is being received. Further, the radio communications device is configured in such a way that power is supplied from the power supply 33 to the transmission circuit 23, the modulation circuit 24, and the transmission frequency synthesizer 25 only during a period of time in which a signal is being transmitted.

To make the radio communications device compact and lightweight, sharing of a variety of constituent elements has already been adopted. For example, the reference frequency signal produced in the reference signal generation circuit 30 of the previously-described radio communications device is utilized not only as a reference signal for the individual synthesizers but also as an operation clock signal of a digital control circuit for controlling the pulse division means.

If the configuration intended to make the portable radio communications device compact and lightweight and to save power consumption deteriorates the characteristics of the radio communications device, a total loss of effectiveness will result. Even in a case where the reference frequency signal generated by the reference signal generation circuit is used also as the reference signal for the frequency synthesizer and as an operation clock signal for the digital control circuit, there arises a phenomenon in which undesired noise components produced by the digital control circuit flow through the operation clock signal line in a reverse direction and are mixed into the reference frequency signal of the frequency synthesizer.

To prevent such a phenomenon, as shown in FIG. 5, a buffer amplifier 2 is interposed between a digital control circuit 6 and a reference signal generator 1. With such a configuration, undesired noise components produced in the digital control circuit 6 are prevented from flowing to the frequency synthesizer 5, thereby preventing deterioration of the characteristics of the frequency synthesizer.

SUMMARY OF THE INVENTION

The present invention has been conceived in consideration of the foregoing drawback of the prior art, and the object of the present invention is to provide a compact, lightweight, portable radio device of reduced power consumption.

To this end, a portable radio device according to the present invention is configured in such a way as to turn on or off the power fed to a buffer amplifier interposed between a reference signal oscillator and a digital control circuit, as well as to perform switching between the frequency band of a signal output from a voltage-controlled oscillator of a frequency synthesizer and the resonance frequency of a matching circuit of an antenna, according to the operating status of the radio device.

With such a configuration, power consumption of the portable radio can be reduced device and the simplification of circuit scale can be accomplished without adversely affecting the characteristics of the portable radio device.

According to a first aspect of the present invention, there is provided a portable radio device including a frequency synthesizer for generating a local signal for a radio section, a digital control circuit for controlling a portion of or the entirety of the radio device, and a reference signal generator for activating the frequency synthesizer and the digital control circuit, the radio device comprising: a buffer amplifier provided between the reference signal generator and the digital control circuit; and switching means provided between the reference signal generator and the digital control circuit in parallel with the buffer amplifier, wherein when the frequency synthesizer is inactive, the switching means is activated, and the power fed to the buffer amplifier is shut off. As a result, the power consumption of the buffer amplifier can be reduced without deteriorating the characteristics of the frequency synthesizer.

According to a second aspect of the present invention, the activation or deactivation of the switching means and the turning on or off of the power fed to the buffer amplifier are carried out in synchronism with a time division multiple access (hereinafter referred to simply as "TDMA") operation. As a result, the power consumption of the buffer amplifier can be reduced faithfully in accordance with the transmission and receiving periods for the TDMA operation.

According to a third aspect of the present invention, a voltage-controlled oscillator of the frequency synthesizer is provided with a frequency band switching control terminal, and the frequency band of an output signal is switched according to a control signal entered by way of the control terminal. As a result, the frequency band of the output signal can be broadly changed without deteriorating the accuracy of the frequency.

According to a fourth aspect of the present invention, the frequency band of the signal output from the voltage-controlled oscillator is switched in synchronism with the TDMA operation. As a result, a single frequency synthesizer can be used for both transmission and receiving operations, thus enabling simplification of circuit scale of the portable radio device.

According to a fifth aspect of the present invention, there is provided a portable radio device having a matching circuit or a resonance circuit provided between an antenna and an electric circuit, wherein the resonance circuit or the matching circuit is provided with a frequency band switching control terminal, and the resonance frequency of the resonance circuit or the matching circuit is switched according to a control signal entered by way of the control terminal. With such a circuit configuration, a narrow effective frequency bandwidth of the antenna can be broadened.

According to a sixth aspect of the present invention, switching between the resonance frequency of the resonance circuit and the resonance frequency of the matching circuit is carried out in synchronism with a TDMA operation. The transmission and receiving characteristics of the antenna used for both transmission and receiving operations can be improved by matching the effective frequency band of the antenna to a transmission frequency during a transmission period and by matching the effective frequency band to a receiving frequency during a receiving period. BRIEF DESCRIPTION OF THE DRAWINGS FIG. 1 is a functional block diagram showing an example of circuit configuration of a portable radio device according to a first embodiment of the present invention;

DETAILED DESCRIPTION OF THE PREFERRED EMBODIMENTS

Embodiments of the present invention will now be described by reference to the accompanying drawings.

First Embodiment

A first embodiment is directed to a circuit configuration for the purpose of reducing power consumption to a greater extent in a case where a reference frequency signal is used as both a reference signal for a frequency synthesizer and an operation clock signal for a digital control circuit.

Figure 1:
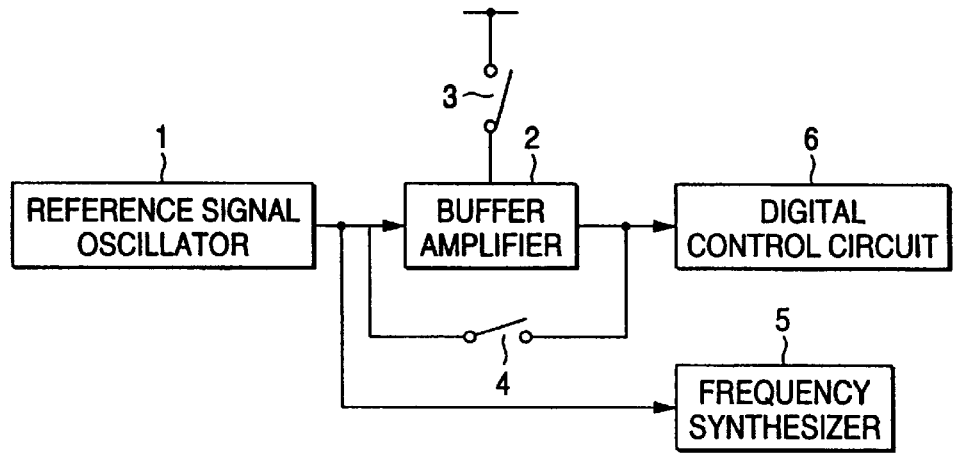

As shown in FIG. 1, the circuit comprises a reference signal oscillator 1 for generating a reference signal; a digital control circuit 6 which utilizes the reference signal as an operation clock signal; a frequency synthesizer 5 which uses the reference signal as a reference comparison signal for a PLL circuit; a buffer amplifier 2 which prevents unwanted noise components generated by the digital control circuit 6 from flowing into a wiring line of the frequency synthesizer 5; a bypass switching circuit 4 which forms a bypass for the buffer amplifier 2; and a switching circuit 3 which turns on or off the power fed to the buffer amplifier 2.

Figure 5:
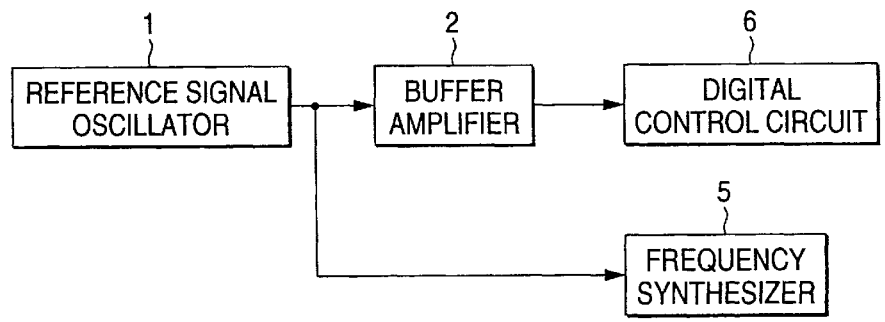
FIG. 5 is a functional block diagram showing an example of circuit configuration of the conventional portable radio communications device.

The circuit configuration shown in FIG. 1 is equal to the circuit configuration shown in FIG. 5, except that the circuit configuration shown in FIG. 1 is additionally provided with the bypass switching circuit 4 and the switching circuit 3 for turning on or off the power fed to the buffer amplifier 2. In the circuit configuration shown in FIG. 5, even when the frequency synthesizer is inactive for the purpose of reducing power consumption, the buffer amplifier 2 must be continually activated in order to activate the digital control circuit 6, thus resulting in a corresponding increase in the consumption of electric current.

In the circuit according to the first embodiment, when the frequency synthesizer 5 is active, the switching circuit 4 is brought into a disconnected state by means of a control signal, whereas the power switching circuit 3 is brought into a connected state. As a result, the buffer amplifier 2 becomes active. At this time, the signal output from the reference signal generator 1 is used as a reference comparison signal in the frequency synthesizer circuit 5. Further, the digital control circuit 6 utilizes as an operation clock signal the signal entered by way of the buffer amplifier 2.

In this case, the buffer amplifier 2 interposed between the reference signal generator 1 and the digital control circuit 6 prevents unwanted noise components generated by the digital control circuit 6 from reaching the frequency synthesizer 5 by way of a wiring line. Therefore, there can be prevented deterioration of the characteristics of the signal output from the frequency synthesizer circuit 5.

In contrast, when the frequency synthesizer circuit 5 is inactive, the switching circuit 4 is brought into a connected state by means of the control signal, whereas the power switching circuit 3 is brought into a disconnected state, thus rendering the buffer amplifier 2 inactive. At this time, the signal output from the reference signal generator 1 reaches the digital control circuit 6 by way of the switching circuit 4 and is utilized as an operation clock signal.

In this case, since the buffer amplifier 2 is not used, power dissipation of the buffer amplifier 2 becomes zero. Although the unwanted noise components generated by the digital control circuit 6 are delivered to the frequency synthesizer 5, the frequency synthesizer 5 is inactive, and hence the characteristics of the signal output from the frequency synthesizer 5 remain unaffected.

As mentioned above, in this circuit, the switching circuits 3 and 4 are alternately brought into a connected state in synchronism with a time-division operation such as a TDMA operation, and the connection of the switching circuit 3 and the connection of the switching circuit 4 are switched in tune with intermittent receiving operations during the wait of the frequency synthesizer 5. As a result, a mean electric current dissipated by the entire radio device can be reduced while various characteristics of the frequency synthesizer circuit 5 are maintained.

For example, provided that an electric current dissipated when the buffer amplifier 2 is in operation is 10 mA, a mean electric current dissipated by the buffer amplifier 2 at the time of an intermittent operation, i.e., when a receiving operation is performed only for the one-hundredth of a second, is 0.1 mA. Thus, there can be accomplished a considerable reduction in the amount of electric current.

Second Embodiment

In a second embodiment, an explanation is given of a circuit configuration for rendering a portable radio device compact and lightweight by use of a frequency synthesizer for both receiving and transmission operations.

Figure 2:
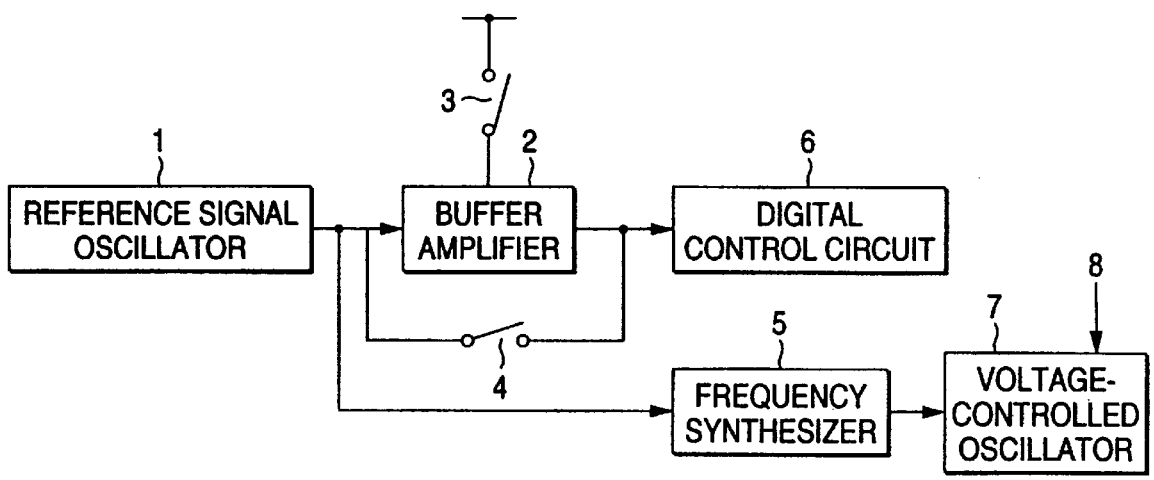
FIG. 2 is a functional block diagram showing an example of circuit configuration of a portable radio device according to a second embodiment of the present invention.

As shown in FIG. 2, in this circuit, the voltage-controlled oscillator (VCO) 7 of the frequency synthesizer 5 is configured so as to switch the frequency band according to the control signal 8. In other respects, the circuit according to the second embodiment is identical in structure with that according to the first embodiment.

Various characteristics of a signal output from the VCO of the frequency synthesizer, which are represented by a signal-to-noise (S/N) ratio, are determined by means of the control sensitivity of the VCO; namely, a frequency bandwidth in which the VCO varies corresponds to a dc voltage entered into the control terminal of the VCO. In a case where the control sensitivity of the VCO is increased, the output frequency of the signal can be changed over a wide range. However, the characteristics of the output signal are deteriorated, e.g., the signal-to-noise ratio (S/N) is decreased.

The VCO 7 according to the second embodiment has a separate input terminal for the frequency band switching control signal 8. The frequency band of the output signal can be changed in a stepped manner by inputting the frequency band switching control signal 8 to the input terminal. Accordingly, the frequency synthesizer 5 can output an oscillation signal having a wide frequency band or a plurality of frequency bands without involving an increase in the control sensitivity of the VCO 7, by utilization of the frequency band switching control signal 8.

The single synthesizer 5 can also be used as, e.g., a transmission frequency synthesizer, at the time of a transmission operation, by inputting the frequency band switching control signal 8 to the VCO 7 in synchronism with a time-division operation, such as a TDMA operation, without deteriorating the characteristics of the signal output from the synthesizer 5. Further, at the time of a receiving operation, the frequency synthesizer 5 can be used as a receiving frequency synthesizer.

In this way, the circuit can be used over a wide frequency band without deteriorating the characteristics of the VCO.

Third Embodiment

In a third embodiment, an explanation is given of a circuit configuration which extends the frequency band of an antenna used in the portable radio device.

Figure 3:
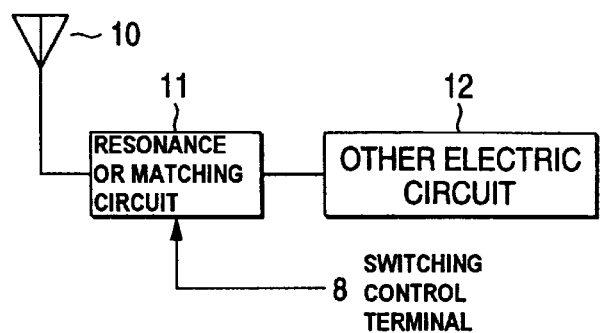
FIG. 3 is a functional block diagram showing an example of circuit configuration of a portable radio device according to a third embodiment of the present invention.
Figure 4:
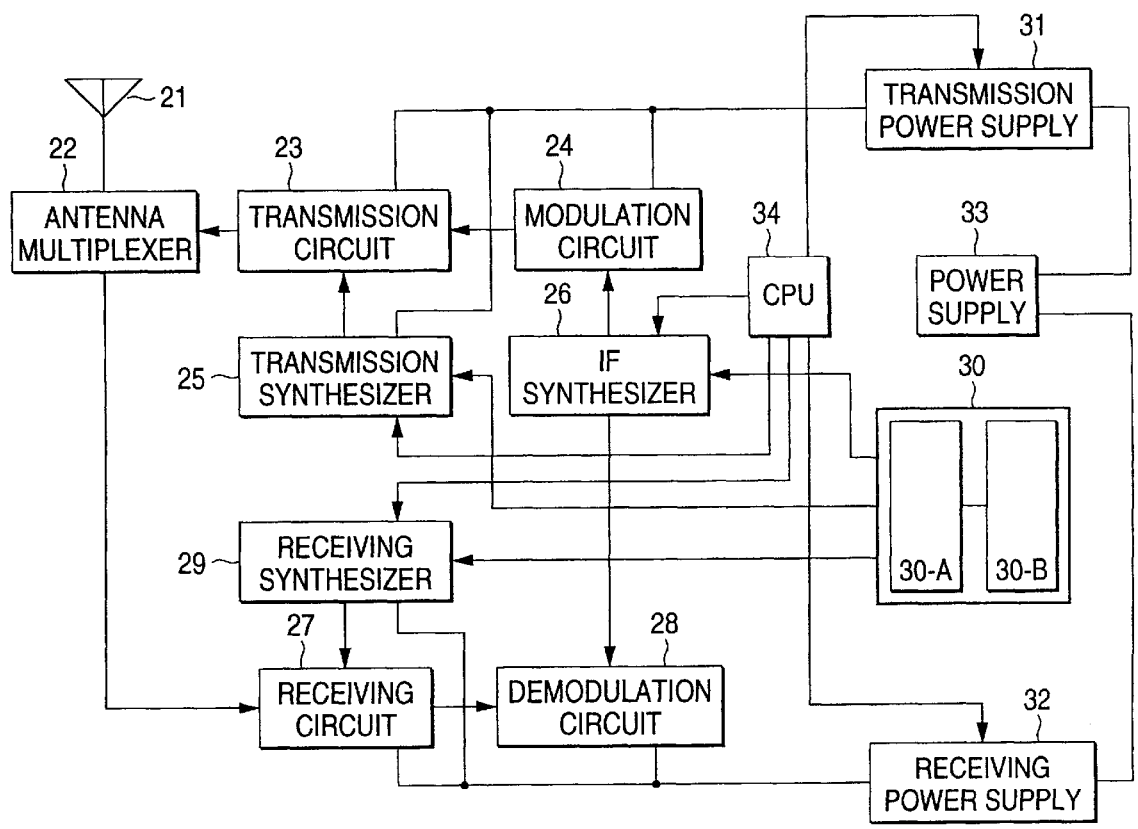
FIG. 4 is a block diagram showing the configuration of a conventional radio communications device.

As shown in FIG. 3, this circuit is arranged in such a way that a matching circuit 11 interposed between the antenna circuit 10 and the other electric circuit 12 switches the resonance frequency of the matching circuit 11 according to the control signal 8.

In general, the antenna circuit 10 has a narrow effective frequency band, which in turn makes it difficult to ensure sufficient characteristics of the radio device over the entire frequency band available for the radio device.

In the circuit according to the third embodiment, the matching circuit 11 has an input terminal for the frequency band switching control signal 8, and the control signal 8 enables changing of the electrical length or resonance frequency of the antenna circuit 10 relative to the other electric circuit 12. Accordingly, the antenna circuit 10 having a narrow effective frequency band can be used over a wide frequency band or a plurality of frequency bands by utilization of the frequency band switching control signal 8.

The frequency band switching control signal 8 is input to the matching circuit 11 in synchronism with a time-division operation, such as a TDMA operation. As a result, the antenna circuit 10 having a narrow effective frequency band can be used as an antenna capable of producing resonance over a transmission frequency at the time of a transmission operation, as well as capable of producing resonance over a receiving frequency at the time of a receiving operation.

As is evident from the foregoing descriptions, the portable radio device according to the present invention can realize a reduction in power consumption and enables sharing of a circuit element by switching circuit operations through use of a control signal according to the operating status of the radio communications device without adversely affecting the characteristics of the portable radio device.

Accordingly, there can be realized low power consumption, which is the challenge of the portable radio device, simplification of circuit scale, and a compact and lightweight portable radio device.

What is claimed is:

1. A portable radio device comprising:
    a frequency synthesizer for generating a local signal for a radio section;
    a digital control circuit for controlling a portion of or the entirety of the radio device;
    a reference signal generator for activating the frequency synthesizer and the digital control circuit;
    a buffer amplifier provided between the reference signal generator and the digital control circuit; and
    switching means provided between the reference signal generator and the digital control circuit in parallel with the buffer amplifier,
        wherein when the frequency synthesizer is inactive, the switching means is activated, and the power fed to the buffer amplifier is shut off.

2. The portable radio device as defined in claim 1, wherein the activation or deactivation of the switching means and the turning on or off of the power fed to the buffer amplifier are carried out in synchronism with a time division multiple access operation.

3. The portable radio device as defined in claim 1, wherein a voltage-controlled oscillator of the frequency synthesizer is provided with a frequency band switching control terminal, and the frequency band of an output signal is switched according to a control signal entered by way of the control terminal.

4. The portable radio device as defined in claim 3 wherein the frequency band of the signal output from the voltage-controlled oscillator is switched in synchronism with the Time Division Multiple Access operation.

* * * * *